AMPLIFIER

Filed Sept. 23, 1957

WITNESSES
Edwin E. Bassler
Myron E. Click

INVENTOR
Edward A. Petrocelli
BY
F. E. Browder
ATTORNEY

United States Patent Office 2,917,698

Patented Dec. 15, 1959

2,917,698

AMPLIFIER

Edward A. Petrocelli, Glenshaw, Pa., assignor to Westinghouse Electric Corporation, East Pittsburgh, Pa., a corporation of Pennsylvania Application September 23, 1957, Serial No. 685,683

7 Claims. (Cl. 321—43)

This invention relates to amplifiers in general and in particular to amplifiers utilizing hyperconductive semiconductor diodes.

The advent of a semiconductor diode having such characteristics and on exceeding certain specified reverse current and voltage the diode becomes highly conductive and thereafter will carry a substantial reverse current at low voltages, has lead to new amplifier apparatus applications. The phenomena described above is not a zener breakdown, nor is it an avalanche breakdown. This unique breakdown characteristic can be repeated indefinitely. This breakdown has been designated as a hyperconductive breakdown and a semiconductor diode having such characteristic as will be referred to hereinafter as a hyperconductive diode.

Such a hyperconductive diode with controllable reversible breakdown characteristic or hyperconductive breakdown comprises a first base element which consists of a semiconductor member doped with an impurity to provide a first type of semiconductivity either N or P. Upon this first base element is an emitter element consisting of semiconductor material doped with an opposite type of semiconductivity. This emitter may be prepared by alloying a pellet containing a doping impurity to a wafer of semiconductor material forming the first base element. An emitter junction is present at the zone between the first base and the emitter elements.

In order to facilitate the connecting of the diode into an electrical circuit, a layer of silver or other good conductive material may be fused, alloyed into or soldered with the upper surface of the emitter element. Copper lead wires may be readily soldered to this layer. A second base of opposite semiconductivity is provided next to the first base. A zone where the first and second base elements meet forms a collector junction. Next to the second base element is a mass-of-metal which is a source of carriers that play a critical part in the functioning of the diode. This mass of metal may be neutral or it may have the same doping characteristics as the second base element. The mass-of-metal may be applied to the second base element by soldering, alloying, fusing or other similar well-known methods.

Such a hyperconductive semiconductor diode, as described above, is described in detail in a copending application Serial No. 642,743 entitled "Semiconductor Diode," filed February 27, 1957, assigned to the same assignee as the present invention. For a more detailed description of the construction, characteristics and operation of such a hyperconductive diode, reference is made to the above copending application, Serial No. 642,743.

It is an object of this invention to provide an improved electrical amplifier.

It is a further object of this invention to provide an improved electrical amplifier utilizing a hyperconductive semiconductor diode.

Further objects of this invention will become apparent in the following description when taken in conjunction with the accompanying drawings. In said drawings, for illustrative purposes only, are shown preferred forms of the invention. In the drawings, the manner in which windings have been wound upon a magnetic core member is indicated by the polarity dot convention. The polarity dot convention indicates like instantaneous points of polarity for windings upon the same core.

Figure 1:
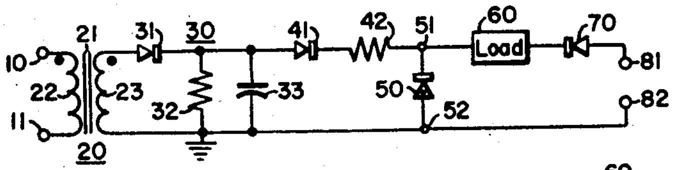
Fig. 1 is a schematic diagram of an improved electrical amplifier embodying the teachings of this invention.

Referring to Fig. 1 there is illustrated a first embodiment of the amplifiers described in this invention. The apparatus illustrated in Fig. 1 comprises in general a terminal means 10 and 11 for applying an input signal, transformer means 20, rectifying and filtering means 30, hyperconductive diode means 50, a load 60 and terminal means 81 and 82 for applying an alternating-current voltage or potential source.

The transformer 20 has a magnetic core 21 having inductively disposed thereon a primary winding 22 and a secondary winding 23. The primary winding 22 is connected to the input terminals 10 and 11. A rectifier 31, a rectifier 41, a resistor 42 and the secondary winding 23 are connected in series circuit relationship between a pair of terminals 51 and 52. The terminal 52 is grounded. The rectifying and filtering means 30 comprises the rectifier 31 plus a resistor 32 and a capacitor 33 connected in parallel between the junction of the rectifier 31 and 41 to ground. The rectifier 70, a load 60, the terminal 51, the hyperconductive diode 50 and the terminal 52 are connected in series-circuit relationship between the terminals 81 and 82.

The operation of the apparatus illustrated in Fig. 1 is as follows. With no input signal present at the input terminals 10 and 11, there will be no voltage output by the secondary winding 23. Therefore the voltage across the capacitor 33 will be zero. The breakdown voltage of the hyperconductive diode 50 is greater than the peak value of the alternating-current voltage to be connected to the terminals 81 and 82.

Figure 6:
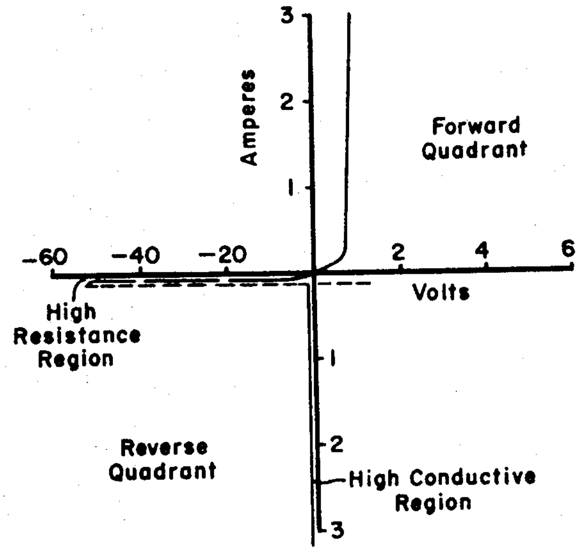
Fig. 6 is a graphical representation of a characteristic of a hyperconductive diode utilized in this invention.

Referring to Fig. 6, the graphical representation illustrates how a hyperconductive diode responds to the application of different voltages. Considering the upper right or forward quadrant, when a forward voltage of the order of 1 voltage unit is applied, the current builds up to approximately 3 current units. When the voltage is reversed on hyperconductive diode, it builds up in the reverse direction to approximately 55 voltage units only a small fraction of a current unit of current flowing, and then the hyperconductive diode suddenly becomes conductive in the reverse direction and the voltage drops to approximately 1 voltage unit as shown in the lower left or reverse quadrant. Thus, the diode then becomes conductive with low ohmic resistance and the current builds up rapidly to several amperes or current units.

As shown in the reverse quadrant in Fig. 6, when the hyperconductive diode breaks down, the voltage drops along a substantially straight line to approximately 1 voltage unit, and very little power is dissipated in maintaining the hyperconductive diode highly conductive in a reverse direction. The hyperconductive diode can be rendered highly resistant again by reducing the current flow below a minimum threshold value and the voltage below breakdown value. Consequently, the curve can be repeatedly followed as desired by properly controlling the magnitude of the reverse current and voltage.

Referring again to Fig. 1, if the breakdown voltage of the hyperconductive diode 50 is greater than the peak value of the alternating-current voltage to be applied to the terminals 81 and 82, then there will be no current flow through the load 60 on either half-cycle of the alternating current voltage to be applied to the terminals 81 and 82. When the terminal 81 is positive with respect to the terminal 82 the hyperconductive diode 50 will prevent current from flowing through the load 60. When the terminal 82 is positive, with respect to the terminal 81, the rectifier 70 will prevent current from flowing through the load 60.

When a small alternating-current signal is applied to the input terminals 10 and 11 the step-up transformer 20 will have a voltage across the secondary winding 23. The rectifier 31 will rectify this voltage and the resistor 32 and the capacitor 33 will then filter the voltage. The voltage appearing across the capacitor 33 will be of a sufficient magnitude to break down the hyperconductive diode 50 by current flowing through the isolating rectifier 41 and the current limiting resistor 42. The current from the voltage across the capacitor 33 must be large enough to cause the hyperconductive diode 50 to go into its negative conduction region.

With the hyperconductive diode 50 broken down and the alternating-current voltage applied to the terminals 81 and 82, current will flow through the load 60 each time the terminal 81 is positive with respect to the terminal 82. When terminal 82 is positive with respect to the terminal 81 the rectifier 70 will still prevent current flow. Thus a half-wave, direct-current voltage is delivered to the load 60.

Figure 2:
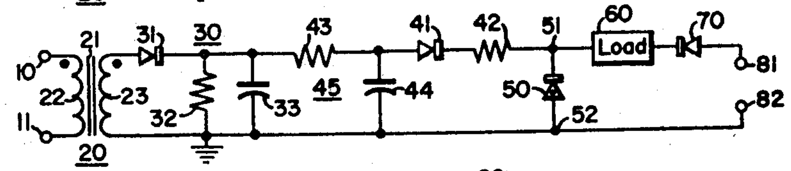
Fig. 2 is a schematic diagram of a second embodiment of this invention.

Referring to Fig. 2 there is illustrated another embodiment of the teaching of this invention, in which like components of Fig. 1 and Fig. 2 have been given the same reference characters. The main distinction between the apparatus illustrated in Figs. 1 and 2 is that in Fig. 2 an additional filter 45 comprising the series resistor 43 and a parallel capacitor 44, has been connected between the junction of the rectifier 31 and the rectifier 41 and ground.

In general, the operation of the apparatus illustrated in Fig. 2 is similar to the operation of the apparatus shown in Fig. 1. However, the addition of the filter 45 comprising the series resistor 43 and the parallel capacitor 44 causes the voltage across the hyperconductive diode 50 at the terminals 51 and 52 to be a very high frequency saw-tooth wave rather than a direct-current voltage as in the apparatus in Fig. 1. In this embodiment current will again flow in the load 60 each time the terminal 81 is positive with respect to the terminal 82. Since the diode 50 is being broken down at the frequency of the saw-tooth wave less power is required of the input signal.

Figure 3:
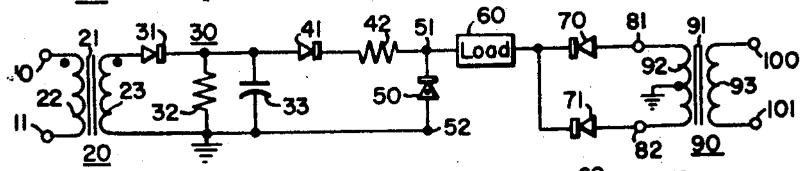
Fig. 3 is a schematic diagram of a third embodiment of this invention.

Referring to Fig. 3 there is illustrated a third embodiment of the teachings of this invention, in which like components of Figs. 1 and 3 have been given same reference characters. The main distinction between the apparatus illustrated in Figs. 1 and 3 is that in Fig. 3 a center tapped secondary winding 92 of a transformer 90 has been connected to the terminals 81 and 82. The transformer 90 comprises a magnetic core member 91 having inductively disposed thereon the center tapped secondary winding 92 and a primary winding 93. The primary winding 93 is connected to a pair of terminals 100 and 101. The center tap of the secondary winding 92 is connected to ground. An alternating current voltage source is to be applied to the terminals 100 and 101. The terminal 82 is no longer connected to the terminal 52, but is instead connected to the terminal 51 through a rectifier 71 and the load 60.

In general, the operation of the apparatus illustrated in Fig. 3 is similar to the apparatus of Fig. 1. However, the addition of the transformer 90 having a center tap secondary with the additional rectifier 71 connected in series between the terminal 82 and the load 60, will allow a full-wave direct-current to flow through the load 60 whenever an input signal is applied to the terminals 10 and 11.

Figure 4:
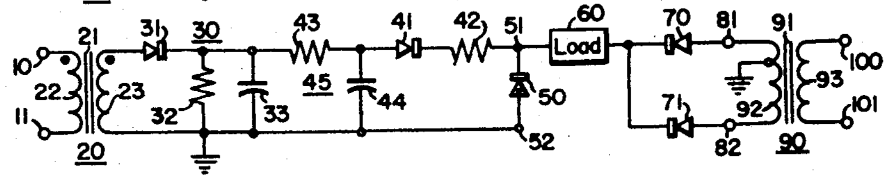
Fig. 4 is a schematic diagram of a fourth embodiment of this invention.

Referring to Fig. 4 there is illustrated a fourth embodiment of the teachings of this invention, in which like components of Figs. 2 and 4 have been given the same reference characters. The main distinction between the apparatus illustrated in Figs. 2 and 4 is that in Fig. 4 a center tapped secondary winding of a transformer 90 has been connected to the terminals 81 and 82. The transformer 90 comprises a magnetic core 91 having inductively disposed thereon a center tapped secondary winding 92 and a primary winding 93. The primary winding 93 is connected to a pair of terminals 100 and 101. A rectifier 71 has been connected in series circuit relationship with the load 60 between the terminals 82 and 52.

In general the operation of the apparatus illustrated in Fig. 4 is similar to the operation of the apparatus shown in Fig. 2. However, the addition of the center tapped secondary winding 92 inductively disposed on the transformer 90 and the series rectifier 71 allows full-wave, direct-current to flow through the load 60.

The circuit illustrated in Figs. 3 and 4 are especially desirable for use when the load 60 is a lamp device. The full-wave, direct-current flow through the lamp would prevent a tendency to flicker.

Figure 5:
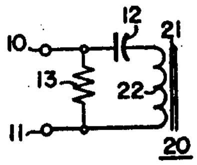
Fig. 5 is a schematic diagram of an alternate input circuit that may be used with the apparatus illustrated in Figs. 1, 2, 3, 4.

Referring to Fig. 5 there is illustrated an alternate input circuit that may be used with the apparatus illustrated in Figs. 1, 2, 3 and 4. A series capacitor 12 and a parallel resistor 13 connected across the capacitor 12 and the primary winding 22 have been coupled to the input primary winding 22 of the transformer 20. The circuit illustrated in Fig. 5 utilizes the resistor 13-capacitor 12 network so that the invention may be used with an input signal to which is a varying or half-wave direct current. This will prevent the magnetic core member 21 of the transformer 20 from being driven to positive saturation, which would cut off the induction of voltage in the secondary winding 23 of the transformer.

The invention hereinbefore described is a completely static control for obtaining high current amplification with low voltage, low current signal levels. The invention may be also used as a direct-current output device or the load 60 may be a lamp for visual indication of the presence or absence of certain conditions.

In conclusion, it is pointed out that although the illustrated examples constitute practicable embodiments of my invention, I do not limit myself to the exact details shown, since modification of the same may be made without departing from the spirit and scope of this invention.

I claim as my invention:

1. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means; said hyperconductive diode means being polarized to oppose current flow from said rectifying and filtering means.

2. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means, said hyperconductive diode means being polarized to oppose current flow from said rectifying and filtering means; said alternating potential having a magnitude less than the predetermined breakdown voltage of said hyperconductive diode means.

3. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means, said hyperconductive diode means being polarized to oppose current flow from said rectifying and filtering means; said alternating potential having a magnitude less than the predetermined breakdown voltage of said hyperconductive diode means; rectifier means serially connected with said alternating potential and pole to block forward current flow through said hyperconductive diode means from said alternating potential.

4. In an amplifier, in combination, hyperconductive diode means, rectifying and filtering means, means for applying an input signal to said rectifying and filtering means, means for coupling an alternating potential across said hyperconductive diode means, means for coupling a load to said hyperconductive diode means; said rectifying and filtering means being connected across said hyperconductive diode means, said hyperconductive diode means being polarized to oppose current flow from said rectifying and filtering means; said alternating potential having a magnitude less than the predetermined breakdown voltage of said hyperconductive diode means; rectifier means serially connected with said alternating potential and pole to block forward current flow through said hyperconductive diode means from said alternating potential; said rectifying and filtering means being electrically isolated from said alternating potential.

5. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means, said hyperconductive means being polarized to oppose current flow from said rectifying and filtering means; said alternating potential having a magnitude less than the predetermined breakdown voltage of said hyperconductive diode means; rectifier means serially connected with said alternating potential and poled to block forward current flow through said hyperconductive diode means from said alternating potential; said rectifying and filtering means being electrically isolated from said alternating potential; said means for applying an input signal to said rectifying and filtering means comprising transformer means having primary and secondary winding means.

6. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means, said hyperconductive diode means being polarized to oppose current flow from said rectifying and filtering means; said alternating potential having a magnitude less than the predetermined breakdown voltage of said hyperconductive diode means; rectifier means serially connected with said alternating potential and poled to block forward current flow through said hyperconductive diode means from said alternating potential; means for isolating said rectifying and filtering means from said alternating potential; said means for applying an input signal to said rectifying and filtering means comprising transformer means having primary and secondary winding means; said primary winding means of said transformer means having filter means connected thereacross whereby a pulsating direct-current input signal is prevented from driving said transformer means to saturation.

7. In an amplifier, in combination, hyperconductive diode means, rectifying and filtering means, means for applying an input signal to said rectifying and filtering means, means for coupling an alternating potential across said hyperconductive diode means, and means for coupling a load to said hyperconductive diode means; said rectifying and filtering means being connected across said hyperconductive diode means said hyperconductive diode means being polarized to oppose current flow from said rectifying and filtering means; said alternating potential having a magnitude less than the predetermined breakdown voltage of said hyperconductive diode means; rectifier means serially connected with said alternating potential and poled to block forward current flow through said hyperconductive diode means from said alternating potential; means for isolating said rectifying and filtering means from said alternating potential; said means for applying an input signal to said rectifying and filtering means comprising transformer means having primary and secondary winding means; said primary winding means of said transformer means having filter means connected thereacross whereby a pulsating direct-current input signal is prevented from driving said transformer means to saturation; said means for coupling an alternating potential across said hyperconductive diode comprising transformer means having primary winding means and center-tapped secondary winding means inductively disposed thereon.

References Cited in the file of this patent

UNITED STATES PATENTS 2,790,088 Shive ---------------- Apr. 23, 1957

OTHER REFERENCES

"Negative Resistance in Germanium Diodes," Radio-Electronic Engineering, April 1953, pages 8–10.